United States Patent
Shafie

(10) Patent No.: US 11,424,634 B2
(45) Date of Patent: Aug. 23, 2022

(54) BATTERY SHUNT IMPLEMENTATION SYSTEMS AND METHODS

(71) Applicant: CPS Technology Holdings LLC, New York, NY (US)

(72) Inventor: Abed Al Fattah Isam Shafie, Glendale, WI (US)

(73) Assignee: CPS Technology Holdings LLC, New York, NY (US)

( * ) Notice: Subject to any disclaimer, the term of this patent is extended or adjusted under 35 U.S.C. 154(b) by 411 days.

(21) Appl. No.: 16/619,015

(22) PCT Filed: Jun. 5, 2018

(86) PCT No.: PCT/US2018/036131
§ 371 (c)(1),
(2) Date: Dec. 3, 2019

(87) PCT Pub. No.: WO2018/226745
PCT Pub. Date: Dec. 13, 2018

(65) Prior Publication Data
US 2021/0151826 A1    May 20, 2021

Related U.S. Application Data

(60) Provisional application No. 62/515,290, filed on Jun. 5, 2017.

(51) Int. Cl.
*H02J 7/00* (2006.01)
*B60L 50/64* (2019.01)
(Continued)

(52) U.S. Cl.
CPC ............ *H02J 7/0045* (2013.01); *B60L 50/64* (2019.02); *B60L 58/18* (2019.02);
(Continued)

(58) Field of Classification Search
None
See application file for complete search history.

(56) References Cited

U.S. PATENT DOCUMENTS

| 2008/0030208 A1 | 2/2008 | Aratani |
| 2011/0076888 A1 | 3/2011 | Fernandez |
| 2016/0139209 A1 | 5/2016 | Tanaka et al. |

FOREIGN PATENT DOCUMENTS

WO    WO 2017002356 A1    1/2017

OTHER PUBLICATIONS

International Search Report and Written Opinion of the International Searching Authority dated Aug. 17, 2018 for PCT/US2018/036131 filed Jun. 5, 2018, 18 pages.

*Primary Examiner* — Carmen V Lyles-Irving
(74) *Attorney, Agent, or Firm* — Boardman & Clark LLP

(57) ABSTRACT

A battery system includes battery cells to store electrical energy and to output electrical power. The battery system further includes a housing, a shunt, a control board, and a connector assembly. The housing includes a cavity that the shunt is disposed in and is in direct contact with, where the cavity facilitates dissipating torsional force exerted on the shunt. The control board is disposed within the housing and includes sensing circuitry to determine an operational parameter of the battery cells and control circuitry to facilitate controlling operation of the battery cells based on the operational parameter. The connector assembly electrically couples the shunt to the sensing circuitry via a spacing connector and a securing connector. The spacing connector is disposed between the control board and an inner surface of the housing while the securing connector extends through the shunt to couple to the spacing connector through the housing.

20 Claims, 8 Drawing Sheets

(51) Int. Cl.
*B60L 58/18* (2019.01)
*H01M 50/172* (2021.01)
*H01M 10/42* (2006.01)
*H01M 10/48* (2006.01)

(52) U.S. Cl.
CPC ....... *H01M 10/4257* (2013.01); *H01M 10/48* (2013.01); *H01M 50/172* (2021.01); *H02J 7/0042* (2013.01); *H02J 7/0047* (2013.01); *B60L 2240/547* (2013.01); *H01M 2220/20* (2013.01)

BATTERY SHUNT IMPLEMENTATION SYSTEMS AND METHODS

CROSS REFERENCE TO RELATED APPLICATIONS

This application is a National Stage Entry of PCT/US2018/036131, entitled "Battery Shunt Implementations Systems and Methods", filed Jun. 5, 2018, which claims priority from and the benefit of U.S. Provisional Application Ser. No. 62/515,290, entitled "Battery Shunt Implementation Systems and Methods," filed Jun. 5, 2017, each of which is hereby incorporated by reference in its entirety for all purposes.

BACKGROUND

The present disclosure relates generally to batteries and battery modules. More specifically, the present disclosure relates to shunt implementation (e.g., packaging) in a battery system.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

Electrical systems often include a battery system to capture (e.g., store) generated electrical energy and/or to supply electrical power. In fact, battery systems may be included in electrical systems utilized for various applications and/or with varying configurations. For example, a stationary power system may include a battery system that receives electrical power output by an electrical generator and stores the electrical power as electrical energy. In this manner, the battery system may supply electrical power to electrical loads using the stored electrical energy.

Additionally, an electrical system in an automotive vehicle may include a battery system that supplies electrical power, for example, to provide and/or supplement the motive force (e.g., power) of the automotive vehicle. The battery system may include a battery control system that controls (e.g., monitors and/or manages) operation of the battery system. For example, the battery control system may determine operational parameters (e.g., voltage and/or current) of the battery system and instruct the battery system to adjust operation based at least in part on the operational parameters. Thus, implementation of the battery control system may vary based at least in part on implementation (e.g., configuration and/or organization) of the battery system. The battery system may also include sensing circuitry that detects the operational parameters. However, in some instances, coupling of the sensing circuitry to the remainder of the battery system may be affected when the battery system is in operation, which, at least in some instances, may affect a measurement accuracy of the operational parameters.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to a battery system that includes one or more battery cells configured to store electrical energy and to output electrical power using the electrical energy. The battery system further includes a first housing, a shunt, a control board, and a connector assembly. The first housing includes a cavity formed on a first outer surface of the first housing, where the cavity includes a first sidewall. The shunt is disposed within the cavity formed in the first housing, where the shunt includes a first side surface that directly contacts the first sidewall to facilitate dissipating torsional force exerted on the shunt. The control board is disposed within the first housing, where the control board includes sensing circuitry configured to determine an operational parameter of the one or more battery cells using the shunt and the control board also includes control circuitry configured to facilitate controlling operation of the one or more battery cells based at least in part on the operational parameter. The first connector assembly electrically couples the shunt to the sensing circuitry of the control board, where the first connect assembly includes a first spacing connector and a first securing connector. The first spacing connector is disposed between the control board and an inner surface of the first housing while the first securing connector extends through the shunt and is coupled to the first spacing connector through the first housing.

The present disclosure also relates to a battery system that includes a housing, a shunt, a control board, and a first connector assembly. The housing includes a cavity formed on a first outer surface of the housing, where the cavity includes a sidewall. The shunt is disposed within the cavity formed in the housing, where the shunt includes a side surface that directly contacts the sidewall to facilitate dissipating torsional force exerted on the shunt, where the shunt is configured to be electrically coupled to a bus bar of the battery system. The control board is disposed within the housing, where the control board includes sensing circuitry configured to determine an operational parameter of the battery system and control circuitry configured to facilitate controlling operation of the battery system based at least in part on the operational parameter. The first connector assembly electrically couples the shunt to the sensing circuitry of the control board, where the first connect assembly includes a first spacing connector and a first securing connector. The first spacing connector is disposed between the control board and an inner surface of the housing while first securing connector extends through the shunt and is coupled to the first spacing connector through the housing.

The present disclosure further relates to a battery system that includes a first housing, a second housing, a shunt, a control board, and a connector assembly. The first housing includes a cavity formed on an outer surface of the first housing, where the cavity includes a first sidewall. The second housing is implemented to be disposed adjacent to an inner surface of the first housing. The shunt is disposed within the cavity formed in the first housing, where the shunt includes a side surface that directly contacts the first sidewall to facilitate dissipating torsional force exerted on the shunt, and where the shunt is implemented to be electrically coupled to a bus bar of the battery system. The control board is disposed between the first housing and the second housing, where the control board includes sensing circuitry implemented to determine an operational parameter of the battery system and control circuitry implemented to facilitate controlling operation of the battery system based at least in part on the operational parameter. The connector assembly electrically couples the shunt to the sensing circuitry of the control board, where the connect assembly includes a conductive bridge disposed between the control board and the first housing, a first screw that extends through the shunt and the first housing, where the first screw is implemented to couple to a first end of the conductive bridge, and a second screw that extends through the second housing and the control board, where the second screw is implemented to couple to a second end of the conductive bridge.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
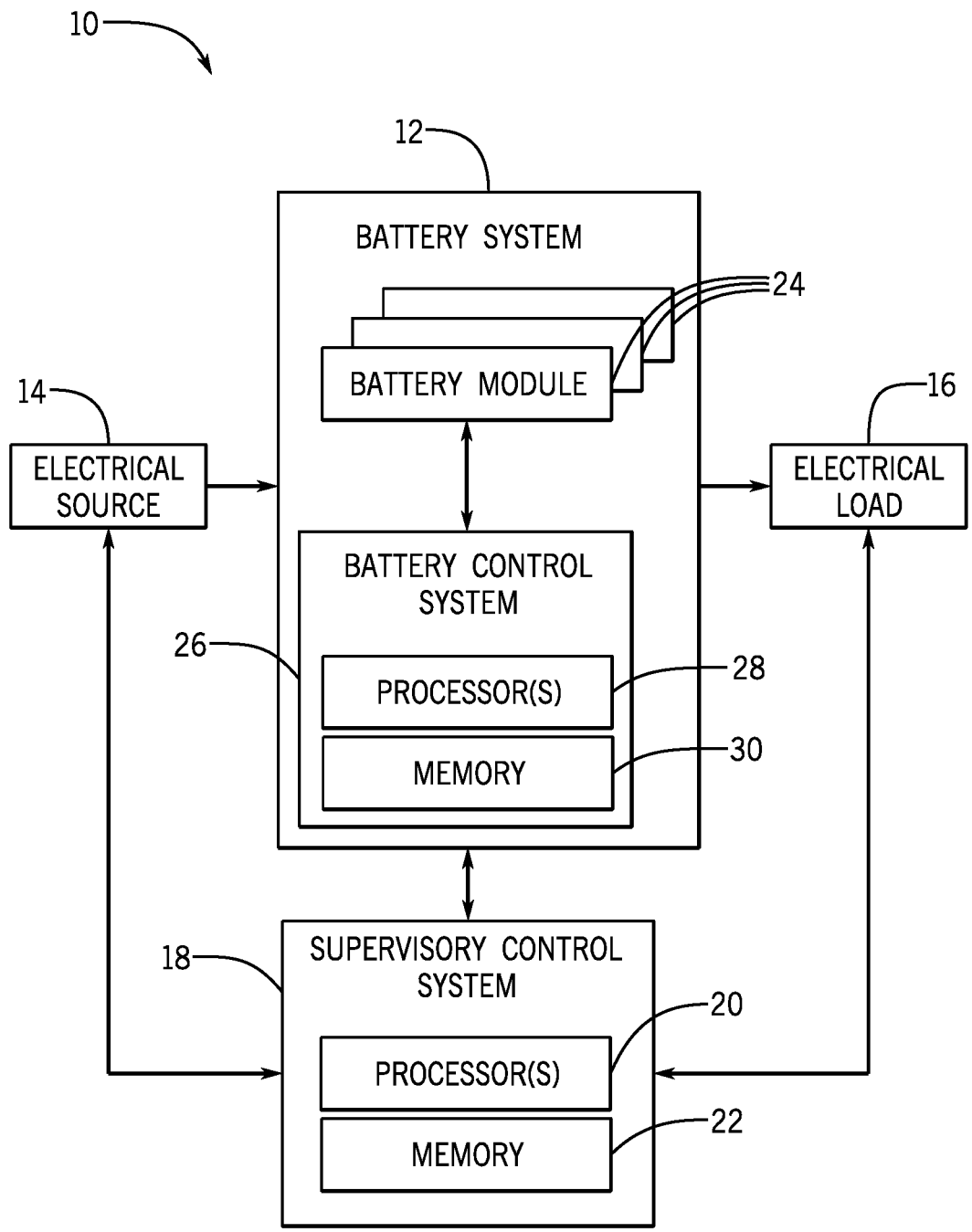
FIG. 1 is block diagram of an electrical system including a battery system, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Generally, battery systems may be implemented to capture (e.g., store) electrical energy generated by one or more electrical generators and/or to supply electrical power to one or more electrical loads using stored electrical energy. Leveraging these benefits, one or more battery systems are often included in an electrical system. In fact, battery systems may be utilized in electrical systems with varying configurations to implement a wide-variety of target applications, for example, ranging from a stationary power system to a vehicular electrical system.

To facilitate implementing different target applications, the configuration of an electrical system and, thus, the battery system used in the electrical system may be adjusted. For example, in one target application, the electrical system may include a first electrical load (e.g., component) designed to operate using electrical power in a high (e.g., 48V, 600V, or 720V) voltage domain and a second electrical load that operates using electrical power in a low (e.g., 3V, 5V, or 12V) voltage domain. As such, the battery system may be implemented to supply electrical power to the first electrical load in the high voltage domain.

In some embodiments, to facilitate providing the high voltage domain, the battery system may be implemented with multiple battery modules (e.g., packs) connected in series as one or more battery strings. Additionally, to facilitate providing sufficient electrical power to operate the first electrical load, in some embodiments, the battery system may be implemented with multiple battery modules and/or multiple battery strings connected in parallel. Furthermore, the battery system and/or an external power source may be implemented to supply electrical power to the second electrical load in the low voltage domain.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems.

The term HEV may include any variation of a hybrid electric vehicle. For example, full hybrid systems (fHEVs) may provide motive and other electrical power to the vehicle using one or more electric motors, using only an internal combustion engine, or using both. In contrast, mild hybrid systems (mHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator.

Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator.

In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

A battery system in any of the aforementioned vehicles may include a battery control system to control operation (e.g., storage of electrical energy and/or supply of electrical power). In particular, the battery control system may control operation of the battery system by performing various functions, such as determining operational parameters (e.g., voltage, current, and/or temperature) related to operation of the battery system, communicating the operational parameters within the battery control system, communicating the operational parameters to an external communication network, and/or determining control commands instructing the battery system to perform control actions. For example, the battery control system may determine operational parameters of one or more battery cells in a battery module, one or more battery modules, one or more battery strings, and/or the battery system as a whole. Additionally, the battery control system may communicate the operational parameters to a supervisory control system that coordinates operation of sub-systems in the electrical system. Furthermore, the battery control system may communicate a control command instructing a relay (e.g., circuit breaker) to open when a fault is detected.

In some embodiments, the battery control system may determine current flow through a battery module and control operation of the electrical system accordingly. To facilitate measuring current flow, a shunt may be electrically coupled to terminals of a battery cell of the battery system and electrically coupled with the rest of the electrical system, for example, to facilitate supplying and/or receiving electrical power. Additionally, the shunt may be electrically coupled to a sensing portion of the battery control system.

Various techniques may be utilized to electrically couple the sensing portion of the battery control system and the shunt. However, in some instances, the various techniques may affect implementation associated cost, such as component count, hardware footprint, and/or manufacturing steps. Moreover, in some instances, the various techniques may affect integrity of signals communicated from the sensing portion of the battery control system and, thus, measurement accuracy.

For example, in certain existing battery control systems, the shunt is coupled, via bus bars and/or soldering, to control circuitry that includes the sensing circuitry. However, certain forces may be imparted on the electrical system that may affect an integrity of the coupling. For example, torsional force may be exerted on the shunt and/or the bus bars, which may impart undesired stress on the solders and/or bus bars. As a result, the solders and/or bus bars may shift in position or otherwise be affected to reduce the electrical connection between the shunt and the control circuitry.

In other existing systems, the sensing circuitry may be separate from the control circuitry and the shunt may be formed on the sensing circuitry, which may be coupled to the control circuitry via a flexible cable, for instance. However, movement of the flexible cable and/or distance between the control circuitry and the sensing circuitry may introduce noise in the communication signals and, thus, affect accuracy of the communication signals. Additionally, separating the sensing circuitry and the control circuitry may increase implementation associated costs, such as number of manufacturing steps.

To facilitate reducing implementation associated cost and/or improving measurement accuracy, the present disclosure provides techniques to implement a shunt in a cavity formed in a battery control system housing and coupled to the battery control system via an electrically conductive connector assembly. Additionally, the battery control system, including a control portion and a sensing portion, may be implemented on a printed circuit board (PCB) disposed within the battery control system housing.

In some embodiments, spacing connectors and securing connectors may couple the shunt to the PCB. For example, the spacing connectors may be electrically conductive receptacles cups coupled to the PCB. In some embodiments, each receptacle cup may include a retaining spring contact. Additionally, in some embodiments, the securing connectors may be electrically conductive press fit pins coupled to each receptacle cup through an opening formed in the battery control system housing. In this manner, a shunt may be press fitted onto the press fit pins, thereby electrically coupling the shunt to the battery control system and mechanically securing the shunt in the cavity. Additionally or alternatively, the shunt may be mechanically secured within the cavity via ridges formed along one or more sidewalls of the cavity, for example, by press fitting.

Moreover, in some embodiments, the securing connectors may include electrically conductive fasteners. For example, a first set of fasteners may couple the housing and the PCB while a second set of fasteners couples the shunt and the housing. Additionally, the spacing connectors may include a set of electrically conductive bridges that may couple the first set of fasteners and the second set of fasteners, thereby electrically coupling the shunt to the battery control system and mechanically securing the shunt in the cavity. In some embodiments, the shunt may additionally or alternatively be mechanically secured in the cavity via overmolding.

Implementing (e.g., packaging) a shunt using any combination of the techniques described herein may increase measurement accuracy. In particular, mechanical (e.g., torsional, vibration, and/or shock) forces may be absorbed by the battery control system housing (e.g., cavity sidewall), thereby reducing likelihood that the torsional force disrupts electrical connections between the shunt and the battery control system, for example, compared to directly soldering the shunt to the PCB. Moreover, a likelihood of electromagnetic interference affecting measurement accuracy may be reduced, for example, compared to the flex cable due to reducing distance measurement signals travel between the sensing portion and the rest of the battery control system. In fact, in some embodiments, a length of the electrical connections (e.g., bridge and/or press fit pin) may be adjusted (e.g., optimized), for example, in a manner that produces acceptable voltage drop readings to improve measurement accuracy. Additionally, implementation associated cost may be reduced by enabling the battery control system to be implemented using fewer (e.g., one) printed circuit boards, for example, compared to implementing a dedicated sensing circuitry PCB that includes the sensing portion on the shunt and communicatively coupling the dedicated sensing circuitry PCB with the control circuitry PCB via a flex cable.

To help illustrate, an electrical system 10 including a battery system 12 is shown in FIG. 1. In addition to the battery system 12, the electrical system 10 also includes an electrical source 14, an electrical load 16, and a supervisory control system 18. In some embodiments, the supervisory control system 18 may control operation of the electrical system 10. For example, the supervisory control system 18 may determine operational parameters of and/or coordinate operation of sub-systems (e.g., the battery system 12, the electrical source 14, and/or the electrical load 16) in the electrical system 10.

To facilitate controlling operation, the supervisory control system 18 may include a supervisory processor 20 and supervisory memory 22. In some embodiments, the supervisory memory 22 may include a tangible, non-transitory, computer readable medium that stores instructions executable by the supervisory processor 20. Thus, in such embodiments, the supervisory memory 22 may include random access memory (RAM), read only memory (ROM), rewritable non-volatile memory (e.g., flash memory), hard drives, optical discs, and the like. Additionally, the supervisory processor 20 may include one or more general purpose processing units and/or processing circuitry. For example, the supervisory processor 20 may include one or more microprocessors, one or more application-specific integrated circuits (ASICs), and/or one or more field programmable logic arrays (FPGAs).

As described above, the battery system 12 may store received electrical power as electrical energy and supply electrical power using the stored electrical energy. Thus, as depicted, the battery system 12 is electrically connected to the electrical source 14, which may enable the electrical source 14 to supply electrical power to the battery system 12. In some embodiments, the electrical source 14 may include one or more machines, components, and/or devices that output electrical power. For example, the electrical source 14 may be a power grid, an electrical generator, an alternator, an energy storage system (e.g., another battery system), or the like.

Additionally, as depicted, the battery system 12 is electrically connected to the electrical load 16, which may enable the battery system 12 to supply electrical power to the electrical load 16. In some embodiments, the electrical load 16 may include one or more machines, components, and/or devices that use the electrical power to perform operations and/or capture the electrical power as electrical energy. For example, the electrical load 16 may include a computer, an engine control unit, a display, a light bulb, an electrical motor, an energy storage system (e.g., another battery system), a heating, ventilating, and air conditioning (HVAC) system, or the like.

In the depicted embodiment, the battery system 12 includes one or more battery modules 24 and a battery control system 26. As used herein, the battery control system 26 describes a part of the battery system 12 that determines an operational parameter of the battery system 12 to control an operation of the battery system 12. For example, the battery control system 26 may determine operational parameters of one or more battery cells of the battery system 12 and facilitate controlling operation of the battery cells based on the operational parameter. It should be understood that the battery control system 26 may be of any configuration to control operation of the battery system 12. That is, the battery control system 26 may include other components to facilitate the control of the battery system 12.

To facilitate controlling operation, the battery control system 26 may include a processor 28 and memory 30. In some embodiments, the memory 30 may include a tangible, non-transitory, computer readable medium that stores data, such as instructions executable by the processor 28, results (e.g., operational parameters) determined by the processor 28, and/or information (e.g., operational parameters) to be analyzed/processed by the processor 28. Thus, in such embodiments, the memory 30 may include random access memory (RAM), read only memory (ROM), rewritable non-volatile memory (e.g., flash memory), hard drives, optical discs, and the like. Additionally, the processor 28 may include one or more general purpose processing units, processing circuitry, and/or logic circuitry. For example, the processor 28 may include one or more microprocessors, one or more application-specific integrated circuits (ASICs), and/or one or more field programmable logic arrays (FPGAs).

Additionally, to facilitate storing electrical energy and supplying electrical power, the battery system 12 may include one or more battery modules 24. In some embodiments, storage capacity of the battery system 12 may be based at least in part on number of battery modules 24. Additionally, in some embodiments, operational compatibility of the battery system 12 with the electrical system 10 may be based at least in part on configuration of the battery modules 24, for example, in series and/or in parallel to operate in a target voltage domain. According, in some embodiments, implementation (e.g., number and/or configuration) of the battery modules 24 and, thus, the battery system 12 may vary based at least in part on configuration and/or target application of the electrical system 10.

However, as described above, electrical systems 10 may be utilized in a wide-range of applications. As such, implementation of different battery system 12 may vary from one another. For example, in some embodiments, the electrical system 10 may be included in a stationary power system, an industrial system, a manufacturing system, an automation system, or the like, such as a factory or plant. Additionally, in some embodiments, the electrical system 10 may be included in a computing system, such as a computer, or an automotive system, such as an automotive vehicle (e.g., airplane, boat, truck, or car).

Figure 2:
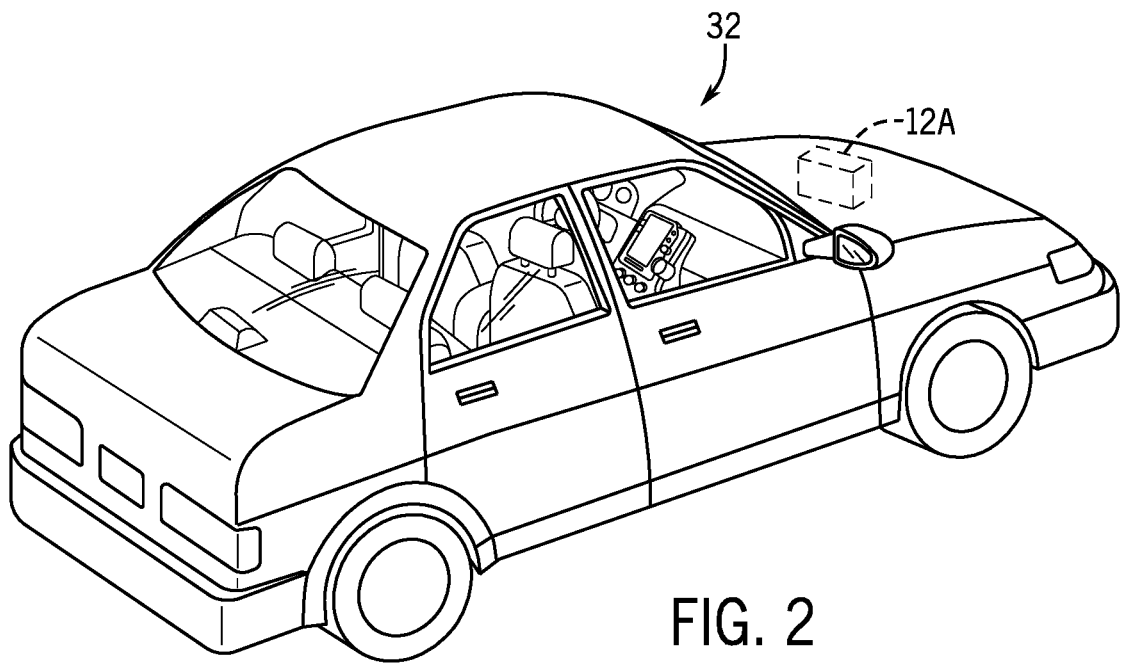
FIG. 2 is a perspective view of an automotive vehicle with the battery system of FIG. 1, in accordance with an embodiment of the present disclosure.

To provide an example of a possible application, an automotive vehicle 32 utilizing a first battery system 12A is shown in FIG. 2. Discussion with regard to the automotive vehicle 32 is merely intended to be help illustrate the techniques of the present disclosure and not to limit scope of the techniques. In some embodiments, the automotive vehicle 32 may be an xEV, which utilizes the battery system 12 to provide and/or supplement vehicular motive force, for example, used to accelerate and/or decelerate the automotive vehicle 32. In other embodiments, the automotive vehicle 32 may be a traditional automotive vehicle 32 that produces vehicular motive force, for example, using an internal combustion engine to accelerate and/or frictional brakes to decelerate.

Figure 3:
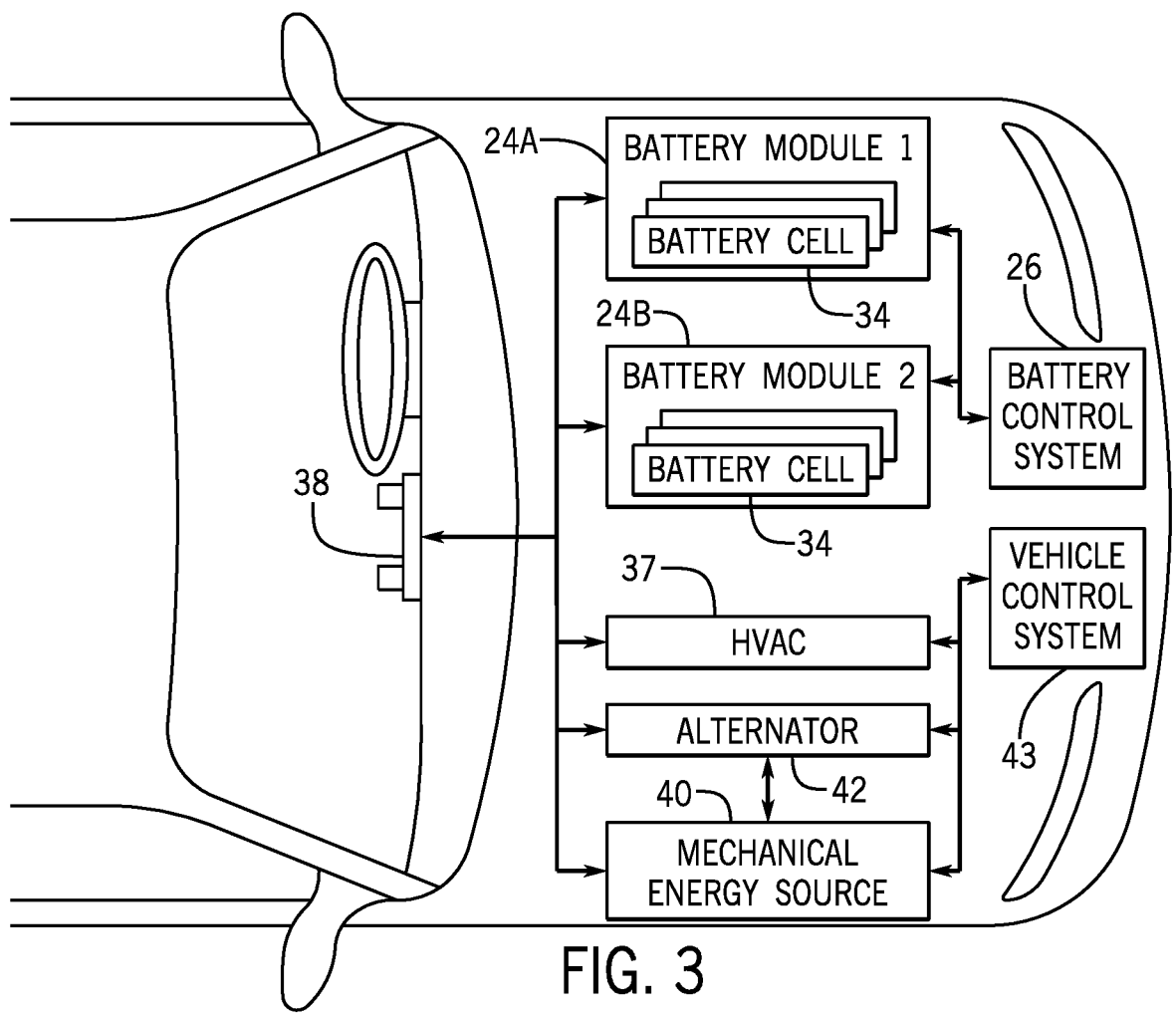
FIG. 3 is a schematic diagram of the automotive vehicle of FIG. 2, in accordance with an embodiment of the present disclosure.

A more detailed view of the first battery system 12A and the electrical system 10 in the automotive vehicle 32 is shown in FIG. 3. As described above, the battery system 12 includes the battery control system 26 and one or more battery modules 24. Additionally, as described above, an electrical system 10 may include an electrical source 14, an electrical load 16, and a supervisory control system 18 in addition the battery system 12. For example, in the depicted automotive vehicle 32, the electrical load 16 may include a vehicle console 38 and a heating, ventilating, and air conditioning (HVAC) system 37. In some embodiments, the electrical load 16 may additional or alternatively include a mechanical energy source 40 (e.g., an electric motor) operating in a motor mode.

Additionally, in the depicted automotive vehicle 32, the electrical source 14 includes an alternator 42, which may convert mechanical energy generated by the mechanical energy source 40 (e.g., an internal combustion engine and/or rotating wheels) into electrical energy. In some embodiments, the electrical source 14 may additionally or alternatively include the mechanical energy source 40 (e.g., an electric motor) operating in a generator mode.

As depicted, the automotive vehicle 32 also includes a vehicle control system 43. In some embodiments, the vehicle control system 43 may generally control operation of the automotive vehicle 32, which includes the electrical system 10. Thus, in the depicted automotive vehicle 32, the supervisory control system 18 may be included in a vehicle control system 43. However, the vehicle control system 43 may additionally control operation of other components other that the electrical system 10, such as an internal combustion engine propulsion system.

As described above, the number and/or configuration of battery modules 24 in different battery systems 12 may vary based at least in part on target application. For example, in the depicted automotive vehicle 32, the battery system 12 includes two battery modules 24—namely a first battery module 24A and a second battery module 24B. In some embodiments, the first battery module 24A may include one or more battery cells 36 connected in series and/or in parallel with terminals of the first battery module 24A. Similarly, in some embodiments, the second battery module 24B may include one or more battery cells 36 connected in series and/or in parallel with terminals of the second battery modules 24B.

In some embodiments, a battery system 12 may include multiple battery modules 24 to facilitate operational compatibility with multiple voltage domains. For example, in the depicted embodiment, the first battery module 24A may operate (e.g., receive and/or supply) using electrical power in a first (e.g., high or 48 volt) voltage domain. On the other hand, the second battery module 24B may operate using electrical power in a second (e.g., low or 12 volt) voltage domain.

Additionally or alternatively, in some embodiments, a battery system 12 may include multiple battery modules 24 to improve implementation flexibility and/or implementation ease. For example, when the first battery module 24A and the second battery module 24B are connected in series, a single battery module 24 may instead be used. However, such a battery module 24 may be large, heavy, and/or produce a higher voltage at its terminals, thereby limiting ease of moving the battery module 24. Additionally, such a battery module 24 may limit implementation flexibility, for example, in another battery system 12 with the first battery module 24A and the second battery module 24B instead connected in parallel.

Figure 4:
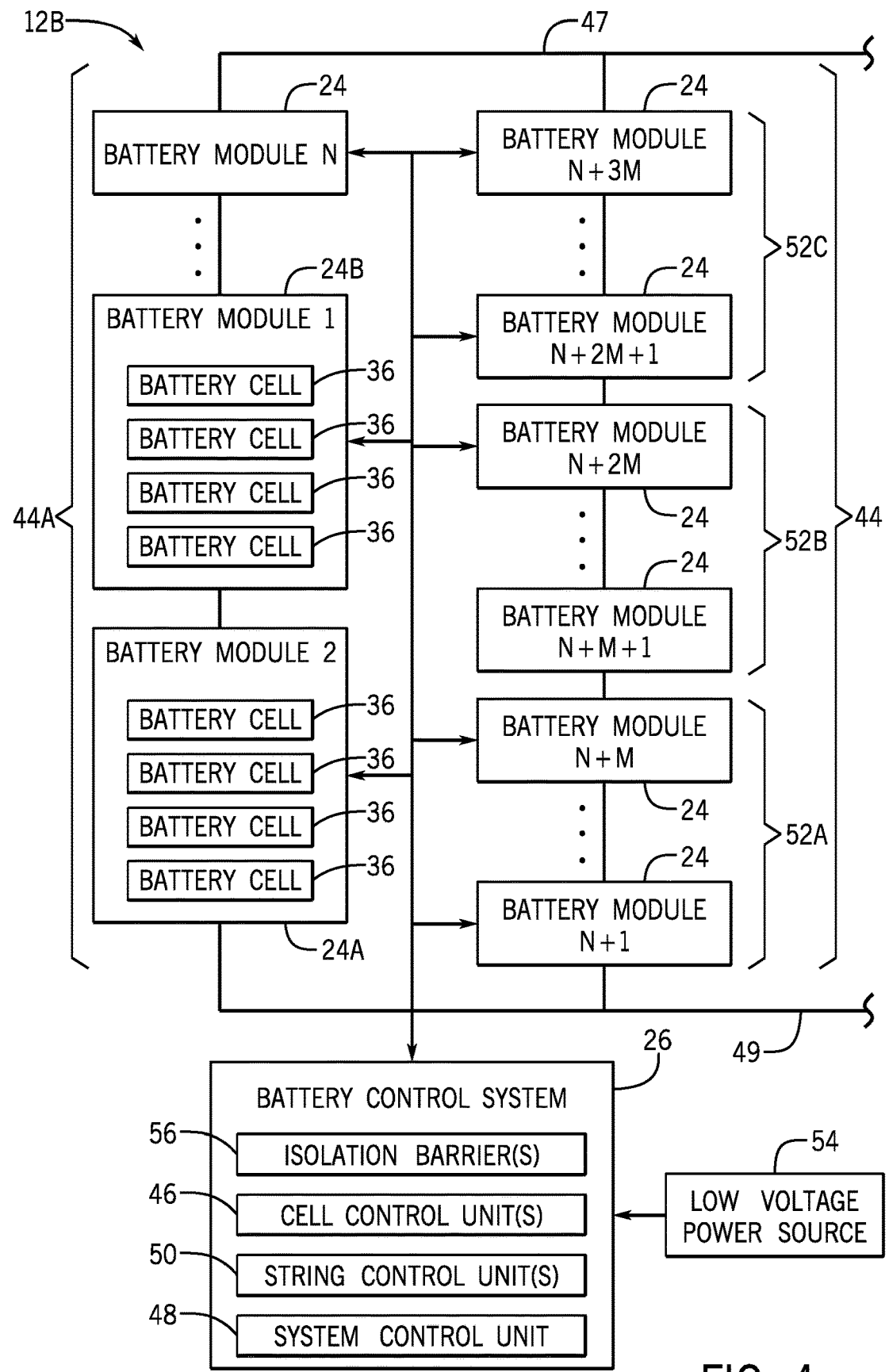
FIG. 4 is a block diagram of the battery system of FIG. 1 including a battery control system, in accordance with an embodiment of the present disclosure.

Comparatively, FIG. 4 shows a second battery system 12B utilized in a different application, such as a stationary power system. As depicted, the second battery system 12B includes a number of battery modules 24 in addition to the first battery module 24A and the second battery module 24B. In particular, the depicted battery system 12 includes multiple battery chains 44, which each includes multiple battery modules 24 connected in series, connected in parallel between a positive bus 47 and a negative bus 49. For example, a first battery chain 44A includes N number of battery modules 24 connected in series. In some embodiments, each battery module 24 may be intended to be electrically identical and, thus, each battery chain 44 may include the same number of battery modules 24.

Due at least in part to the different number of battery modules 24, the battery control system 26 utilized in the first battery system 12A and the battery control system 26 utilized in the second battery system 12B may be different. For example, instead of merely coordinating operation of the first battery module 24A and the second battery module 24B, the battery control system 26 in the second battery system 12B may coordinate operation of multiple battery chains 44. In other words, a different battery control system 26 may perform different control functions—particularly when used in different applications.

To help account for the different control functions, a battery control system 26 may be implemented based at least in part on a battery control system architecture. Generally, multiple different battery control system architectures may be capable of implementing a battery control system 26. However, the multiple different battery control system architectures may have varying effects on implementation flexibility and/or implementation associated cost.

For example, it may be possible to implement a battery system 12 using a purely centralized battery control system architecture specifically designed for the battery control system 26. Since specifically designed for the battery system 12, the purely centralized battery control system architecture may reduce an amount of redundant infrastructure, thereby reducing implementation associated cost. However, the purely centralized battery control system architecture is generally unique to the battery control system 26, thereby limiting implementation flexibility (e.g., number of compatible battery system variations).

On the other extreme, it may be possible to implement a battery control system 26 using a purely distributed battery control system architecture, which provides a basic building block for each potential control function that may be implemented in a battery system 12. In this manner, the building blocks in the purely distributed battery control system architecture may be used to implement a wide variety of battery control system 26, thereby improving implementation flexibility. However, the purely distributed battery control system architecture may result in increasing amount of redundant infrastructure. For example, since each building block may communicate with another building block, increasing number of building blocks may increase communication infrastructure (e.g., communication interfaces and/or busses) used to implement a battery control system 26, thereby increasing implementation associated cost.

Leveraging advantages of the two extremes, in some embodiments, a hybrid battery control system architecture may be used to implement battery control systems 26 with improved implementation flexibility and/or reduced implementation associated cost. In particular, a hybrid battery control system architecture may provide basic building blocks that each provides different levels (e.g., abstractions or granularity) of control. For example, the basic building blocks may include a cell control unit 46 that provides battery module level and/or battery cell level control functions. Additionally, the basic building blocks may include a system control unit 48 that provides battery system level control functions.

Furthermore, the basic building blocks may include a string control unit 50 that provides battery string level control functions. As used herein, a battery string is intended to describe one or more battery modules 24 connected in series. Thus, a battery chain 44 may include one or more battery strings 52. In some embodiments, a battery chain 44 may be divided into multiple battery strings 52 to facilitate maintaining control granularity without significantly increasing control complexity. For example, in the depicted embodiment, a battery chain 44 is divided into three M number of battery modules 24—namely a first battery string 52A, a second battery string 52B, and a third battery string 52C.

Moreover, a hybrid battery control system architecture may provide infrastructure used in each of the building blocks. For example, a hybrid battery control system architecture may specify processing infrastructure, power infrastructure, and/or communication infrastructure included in each of the cell control unit 46, the system control unit 48, and the string control unit 50. In some embodiments, the processing infrastructure may indicate one or more processor units, processing circuitry, and/or logic circuitry used in a building block. Additionally, the communication infrastructure may indicate one or more communication interfaces used in a building block.

Furthermore, the power infrastructure may indicate one or more isolation barrier 56 used in and/or target operating voltage domain of a building block. As described above, a battery system 12 may operate in multiple different voltage domains. For example, in the depicted embodiment, the battery modules 24 may operate in a high voltage domain. Thus, the battery modules 24 may act as a high voltage power source that supplies electrical power to electrical components designed to operate using electrical power in the high voltage domain, which may include a portion of the battery control system 26. However, another portion of the battery control system 26 may be designed to operate using electrical power in a low voltage domain and, thus, receive electrical power from a low (e.g., external) voltage power source 54.

Due to different portions operating in different voltage domains, the battery control system 26 may include one or more isolation barriers 56. In particular, an isolation barrier 56 may electrically isolate electrical components operating in a first (e.g., high) voltage domain and electrical components operating in a second (e.g., low) voltage domain. Additionally, in some embodiments, an isolation barrier 56 may electrically isolate the battery system 12 from a common ground (e.g., system ground), such as a vehicle chassis or a device housing.

In this manner, a battery control system 26 may be implemented using the building blocks specified in a hybrid battery control system architecture, for example, based at least in part on target functions to be provided by the battery control system 26 and functions provided by each of the building blocks. However, in some instances, multiple different hybrid battery control system architectures may be expected to enable implementing a battery control system 26. Moreover, in some instances, the multiple different hybrid battery control system architectures may each have varying effects on implementation flexibility and/or implementation associated cost.

As previously mentioned, the battery control system 26 may operate based on certain operational parameters of the battery system 12, such as current flow through a battery module 24. For example, operation of the cell control unit 46, the system control unit 48, and/or the string control unit 50 may adjust based on a detected current flow. Thus, the battery control system 26 may include a control board with sensing circuitry to detect the current flow and control circuitry to use the detected current flow to adjust operations. Additionally, to place the control board in electrical connection with the battery cells 34 where the sensing circuitry detects current flow, a shunt may couple to terminals of the battery cells 34.

Figure 5:
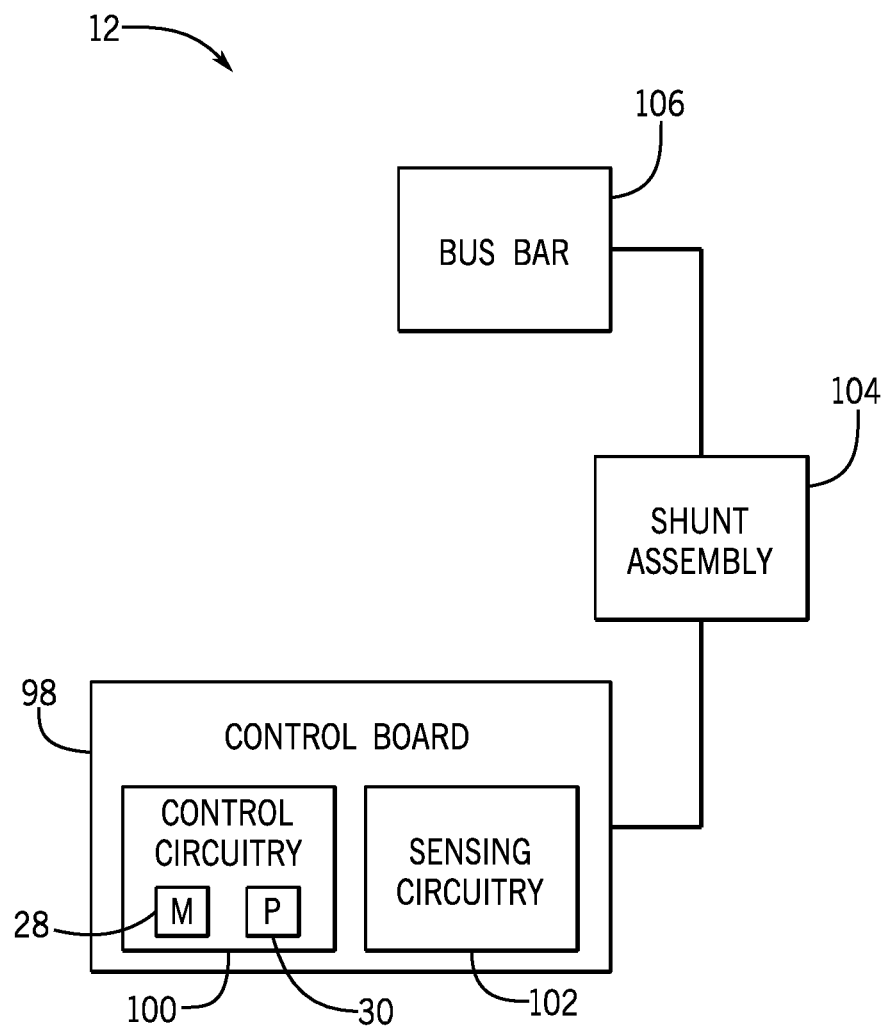
FIG. 5 is a schematic diagram an example of the battery system of FIG. 1 including a shunt assembly, in accordance with an embodiment of the present disclosure.

To help illustrate, an example of a battery system 12, which includes a control board 98 and a shunt assembly 104, is shown in FIG. 5. As depicted, the control board 98 includes control circuitry 100, which may be implemented to control operation of the battery system 12. To facilitate controlling operation, as in the depicted embodiment, the control circuitry may include the processor 28 and/or the memory 30.

As depicted, the control board 98 may also include sensing circuitry 102, which may be implemented to facilitate determining operational parameters of the battery system 12. For example, the sensing circuitry 102 may measure an operational parameter (e.g., current flow) of the battery system 12 and output sensor data indicative of the operational parameter. Thus, based at least in part on the sensor data, the control circuitry 100 may determine the operational parameter of the battery system 12 and control operation accordingly.

To facilitate measuring operational parameters of the battery system 12, a shunt assembly 104 may be coupled between the control board 98 and a bus bar 106. In some embodiments, the bus bar 106 may place the shunt assembly 104 in electrical connection with other components of the electrical system, such as terminals of battery cells and/or terminals of a battery module. The bus bar 106 may be rigid such that, during operation of the battery system 12, the bus bar 106 may impart a force onto the shunt assembly 104. The imparted force may affect an electrical connection between the shunt assembly 104 and the control board 98. It should be understood that in some embodiments, the shunt assembly 104 may be directly coupled to other components in the battery system 12 without a bus bar 106, such as rigid components that may also impart a force onto the shunt assembly 104.

Furthermore, the sensing circuitry 102 may be coupled to the shunt assembly 104 and is implemented to detect the current flow through the shunt assembly 104. The sensing circuitry 102 may be communicatively coupled to the control circuitry 100 to transmit the detected current flow. In this manner, the control circuitry 100 may adjust operations, such as of particular components of the electrical system, based on the detected current flow. The shunt assembly 104 may be coupled to the control board 98 to increase stability of the electrical connections.

Figure 8:
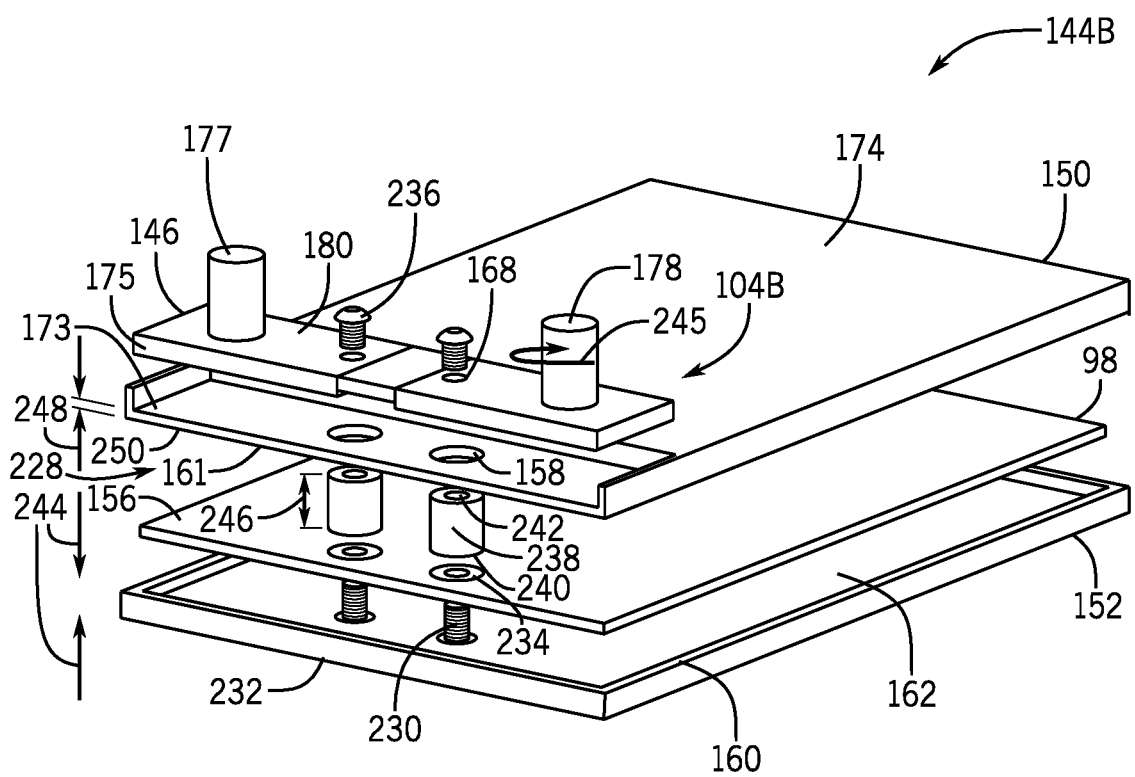
FIG. 8 is a perspective view of another example of the battery system of FIG. 1 including a shunt assembly, in accordance with an embodiment of the present disclosure.

To help illustrate, an example of a portion 144A of a battery system 12, which includes a shunt assembly 104A, is shown in FIG. 8. As depicted, the shunt assembly 104 includes a shunt 146 and a first connector assembly 148. Additionally, the control board 98 may be disposed between a first housing 150 and a second housing 152. For example, the first housing 150 may be disposed on a first (e.g., top) side of the control board 98 and the second housing 152 may be disposed on a second (e.g., bottom) side of the control board 98. In particular, the first housing 150 and the second housing 152 may cover the control board 98 and block unwanted material from contacting the control board 98. As an example, the first housing 150 and the second housing 152 may block other electrically conductive components from contacting the control board 98 that may affect a performance of the control board 98. As such, the first housing 150 and the second housing 152 may include electrically insulative material.

Additionally, the first connector assembly 148 may include one or more electrically conductive receptacles 154 and one or more electrically conductive pins 164. As in the depicted example, each electrically conductive receptacle 154 may include a first end 155 and a second end 157 separated by a ledge 159. In particular, the first end 155 of an electrically conductive receptacle 154 may be implemented to couple to an opening 163 formed in the control board. Additionally, the second end 157 of the electrically conductive receptacle 154 may be implemented to couple to an opening 158 formed in the first housing 150.

In fact, in some embodiments, the height of the ledge 159 implemented on the electrically conductive receptacles 154 may be sized such that a top surface of the ledge 159 is flush with a ledge 160 formed along the perimeter of the second housing 152. In this manner, the electrically conductive receptacles 154 may reduce likelihood of the control board 98 contacting an inner surface 161 of the first housing 150. In other words, the first connector assembly 148 may reduce likelihood of linear forces 244 experienced during operation of the battery system 12 affecting electrical connection between the shunt assembly 104A and the control board 98, which, at least in some instance, may facilitate improving accuracy of operational parameters sensed by the sensing circuitry 102.

To couple the shunt 146 with the control board 98, the first connector assembly may include one or more electrically conductive pins 164. As in the depicted example, each electrically conductive pin 164 may include a first section 166 and a second section 170. In particular, the first section 166 may be implemented to couple to an opening 168 formed in the shunt 146. Additionally, the second section 170 may be implemented to traverse the opening in the first housing 15 and engage the second (e.g., mounting) end 157 of a corresponding electrically conductive receptacle 154. In some embodiments, an electrically conductive pin 164 may press fit into the opening 168 in the first housing 150 and/or press fit into the second end 157 of the electrically conductive receptacle 154, for example, to facilitate maintaining electrical connection between the shunt assembly 104 and the control board 98.

Additionally, the shunt 146 may be disposed within a cavity 173 formed on an outer surface 174 of the first housing 150 such that one or more side surfaces 175 of the shunt 146 are in contact with a sidewall 176 of the cavity 173. The shunt assembly 104 may be secured to the first housing 150, for example, via a press fit into the cavity 173, adhesives, fasteners, overmolding, or any combination thereof. In certain embodiments, ridges may be formed within the cavity 173. For example, ridges may be formed along one or more sidewalls 176 of the cavity 173 to increase friction between side surfaces 175 of the shunt assembly 104 and the sidewalls 176. Additionally or alternatively, ridges may be formed in the second housing 152, such as along the ledges 160, to facilitate securing the first housing 150 and/or the control board 98 to the second housing 152.

As in the depicted example, the shunt 146 may include a first shunt post 177 and a second shunt post 178 that extend in a direction 179 parallel to the side surfaces 175. In some embodiments, the first shunt post 177 may be coupled to a first bus bar 106 and the second shunt post 178 may be coupled to a second bus bar 106. Thus, when the battery system 12 is in operation, electrical power may flow between the first shunt post 177 and the second shunt post 178 through a middle section 180 of the shunt 146.

In some embodiments, the middle section 180 of the shunt 146 may be implemented to provide a resistance to the current flow, where the resistance is low enough such that the current flow is not disrupted, but high enough such that a current flow may be determined. That is, the resistance of the middle section 180 may be known and a voltage drop through the middle section 180 may be detected such that a measurement of the current flow through the middle section 180 may be calculated. In this manner, the current flow through the shunt assembly 104 may be determined and used to control operation of the electrical system. As an example, a portion of the current flow may be directed through the pins 164 and the receptacles 154 to the control board 98. The control board 98 may include sensing circuitry 102 that the portion of the current flow is directed through, where the sensing circuitry 102 determines a measurement of the current. The control board 98 may also include control circuitry 100 that then uses the measured current to determine appropriate operations of the electrical system.

Figure 7:
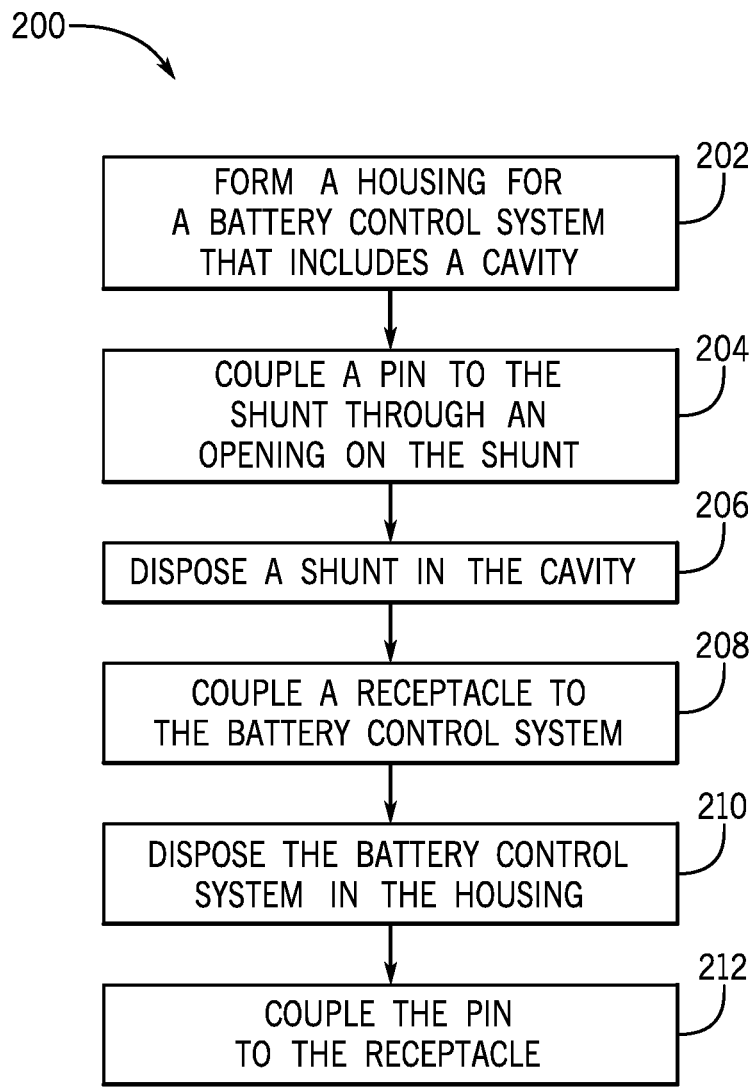
FIG. 7 is a flow diagram of a process for implementing the shunt assembly of FIG. 6, in accordance with an embodiment of the present disclosure.

An embodiment of a process 200 for implementing the shunt assembly 104A is described in FIG. 7. Generally, the process 200 includes forming a housing for a battery control system that includes a cavity (process block 202), coupling a pin to a shunt (process block 204), disposing the shunt in the cavity (process block 206), coupling a receptacle to the battery control system (process block 208), disposing the battery control system in the housing (process block 210), and coupling the pin to the receptacle (process block 212).

As indicated at process block 202, the housing is formed. Specifically, the first housing 150 and the second housing 152 may be formed, where the first housing 150 includes the cavity 173 and the second housing 152 includes the ledges 160. Additionally, the first housing 150 may be formed to include an opening 158. As noted, the first housing 150 and the second housing 152 may include electrically insulative material, such as polymer, foam, rubber, glass, another suitable material, or any combination thereof. The first housing 150 and the second housing 152 may be formed via molding, which may provide a method to quickly and cost efficiently manufacture several parts.

At process block 204, a pin 164 couple to the shunt 146. Specifically, the first section 166 of the pin 164 may be inserted through the shunt 146 via the opening 168. In some embodiments, the first section 166 is press fit into the opening 168 to securely couple the pin 164 with the shunt 146. When the pin 164 is coupled to the shunt 173, the second section 170 may remain exposed.

After the pin 164 is inserted into the shunt 146, the shunt 146 may be disposed into the cavity 173, as indicated at process block 206. As mentioned, the shunt 146 may press fit into the cavity 173 such that the side surfaces 175 of the shunt 146 are in contact with the sidewalls 176 of the cavity 173. Furthermore, when the shunt 146 is inserted into the cavity 173, the second section 170 of the pin is inserted through the opening 158 of the first housing.

At process block 208, a receptacle 154 may be coupled to the control board 98. In some embodiments, the first end 155 of the receptacle 154 may be coupled via a solder, a fastener, a crimp, a press fit, an adhesive, another suitable method, or any combination thereof. The receptacle 154 may be coupled such that the receptacle 154 is in electrical connection with the sensing circuitry 102 and/or the control circuitry 100, while the second end 157 of the receptacle 154 remains exposed out of the control board 98. It should be appreciated that multiple receptacles 154 may be coupled to the control board 98 and that the control board 98 may include specific locations for the receptacle 154 to be disposed therein.

At process block 210, after coupling the receptacle 154 to the control board 98, the control board 98 may be disposed in the housing. As described, the control board 98 may be inserted within the ledges 160 of the second housing 152.

When the control board 98 is inserted into the second housing 152, the ledge 159 of the receptacle 154 may be flush with the ledges 160.

At process block 212, the pin 164 is coupled to the receptacle 154. In this manner, coupling the pin 164 to the receptacle 154 couples the shunt 146, the first housing 150, and the pin 164 to the second housing 152 such that the inner surface 161 of the first housing 150 is flush against the ledge 160 of the second housing 152. Additionally, the second section 170 of the pin 164 may be inserted into the second end 157 of the receptacle such that the pin 164 is electrically coupled to the receptacle 154. For example, the second section 170 may be press fit into the second end 157.

Figure 6:
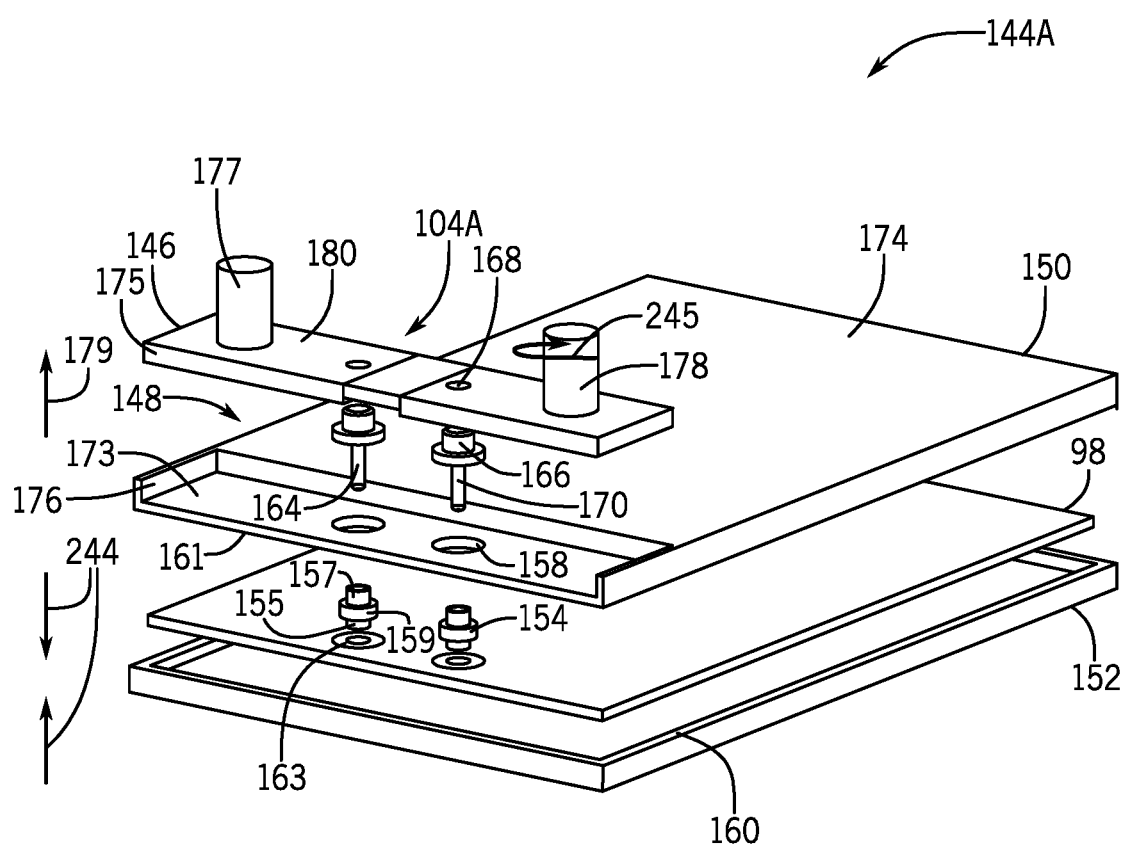
FIG. 6 is a perspective view of an example of the shunt assembly of FIG. 5, in accordance with an embodiment of the present disclosure.

By performing the process 200 of FIG. 6, the components of the battery system 12 may be secured to reduce movement between the components that may affect electrical connections within the battery system 12. Additionally, if forces are imparted onto the battery system 12, such as via a bus bar coupled to the first shunt post 177 and/or the second shunt post 178, a resulting torsional force 245 may propagate to the shunt assembly 104 and may be dissipated to the first housing 150, the receptacle 154, and/or the pin 164, thereby reducing the force on the shunt assembly 104A and/or the control board 98.

Another example of a portion 144B of a battery system 12, which includes a shunt assembly 104B, is shown in FIG. 8. As depicted, the shunt assembly 104 includes a shunt 146 and a second connector assembly 228. Similar to FIG. 5, the control board 98 may be disposed between a first housing 150 and a second housing 152 and the first housing 150 and the second housing 152 may include electrically insulative material to block other electrically conductive components from contacting the control board 98.

Additionally, the second connector assembly 228 may include a first set of one or more fasteners 230, one or more electrically conductive bridges 238, and a second set of one or more fasteners 236. In particular, each fastener 230 of the first set may be implemented to extend from an inner surface 162 the second housing 152 through an opening 234 in the control board 98. On the other hand, each fastener 236 of the second set may be implemented to extend through an opening 168 formed in the shunt 146 and an opening 158 formed in the first housing 150. In some embodiments, the fasteners 230 of the first set and/or the fasteners 236 of the second set may include one or more screws that extend through the housing and/or one or more screws molded (e.g., integrated) into the housing. To facilitate securing the shunt 146 to the housing, a bridge 238 may be coupled between fastener pairs. In particular, a first side 240 of the bridge 238 may be implemented to couple to a fastener 230 of the first set and a second side 242 of the bridge 238 may be implemented to couple to a fastener 236 of the second set.

In fact, in some embodiments, the height of the bridges 238 may be sized such that a top surface of the bridges 238 is flush with a ledge 160 formed along the perimeter of the second housing 152. In this manner, the bridges 238 may reduce likelihood of the control board 98 contacting an inner surface 161 of the first housing 150. In other words, the second connector assembly 228 may reduce likelihood of linear forces 244 experienced during operation of the battery system 12 affecting electrical connection between the shunt assembly 104A and the control board 98, which, at least in some instance, may facilitate improving accuracy of operational parameters sensed by the sensing circuitry 102.

Operation of the battery system 12 of FIG. 8 may be similar to operation of the battery system 12 of FIG. 6. That is, current may flow between the first shunt post 177 and the second shunt post 178 through the slightly resistive middle section 180. The first set of fasteners 230, the second set of fasteners 236, and the bridges 238 may each be electrically conductive such that a portion of the current is directed from the shunt assembly 104 to the control board 98, where the current may be detected by the sensing circuitry 102 to determine a measurement of the current.

The control board 98, the first housing 150, the second housing 152, the first connector assembly 148, and/or the second connector assembly 228 may be disposed within the battery modules 24, such as a housing of the battery modules 24, of the battery system 12. Although FIGS. 6 and 8 illustrate there being a specific number of components, such as receptacles 154, pins 164, fasteners 230, fasteners 236, and bridges 238, it should be appreciated that there may be any number of such components to suitably couple the shunt assembly 104 with the control board 98, such as multiple control boards 98 disposed within the first housing 150 and the second housing 152. Additionally, each of FIGS. 6 and 8 may include a different suitable shape. Indeed, particular dimensions, such as the pins 164 and/or the bridges 238 may be adjusted based on a desired measurement accuracy of current.

In certain embodiments, the control board 98 is coupled to a single shunt assembly 104, but it should be understood that the control board 98 may be coupled to additional shunts 104, where each shunt assembly 104 may be coupled to a battery cell 34. Accordingly, a location of the cavity 173 and the attachment of the shunt assembly 104 and the associated components may be adjusted. As such, the control board 98 may be implemented to detect current flowing through multiple battery cells 34. In additional or alternative embodiments, the battery modules 24 may include multiple control boards 98, each implemented to detect current flowing through a battery cell 34 or a group of battery cells 34. Moreover, the components of the aforementioned embodiments are not exclusive and additional components not already mentioned may be implemented into the battery system 12, such as to facilitate coupling of the control board 98, the shunt assembly 104, the first housing 150, and the second housing 152.

Figure 9:
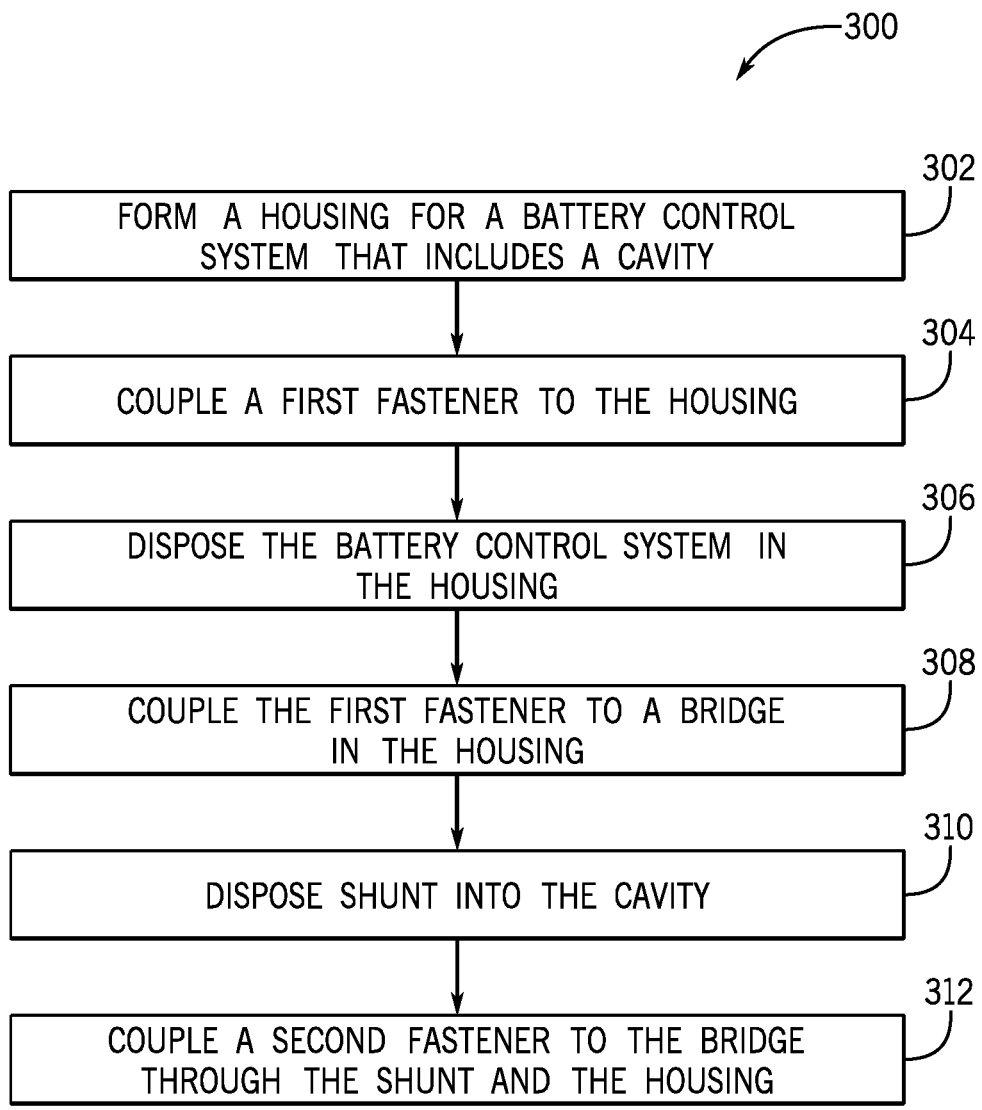
FIG. 9 is a flow diagram of a process for implementing the shunt assembly of FIG. 8, in accordance with an embodiment of the present disclosure, in accordance with an embodiment of the present disclosure.

An embodiment of a process 300 for implementing the shunt assembly 104B is described in FIG. 9. Generally, the process 300 includes forming a housing for a battery control system that includes a cavity (process block 302), coupling a first fastener to the housing (process block 304), disposing the battery control system in the housing (process block 306), coupling the first fastener to a bridge in the housing (process block 308), disposing a shunt into the cavity (process block 310), and coupling a second fastener to the bridge through the shunt and the housing (process block 312).

As indicated at process block 302, the housing is formed. Specifically, the first housing 150 and the second housing 152 may be formed, where the first housing 150 includes the cavity 173 and the second housing 152 includes the ledges 160. Additionally, the first housing 150 may be formed to include an opening 158. As noted, the first housing 150 and the second housing 152 may include electrically insulative material, such as polymer, foam, rubber, glass, another suitable material, or any combination thereof. The first housing 150 and the second housing 152 may be formed via molding, which may provide a method to quickly and cost efficiently manufacture several parts.

After forming the housing, at process block 304, a first fastener is coupled to the housing. The first fastener may be of the first set of fasteners 230 and, thus, may be coupled to the second housing 152, for example, via soldering and/or adhesive. Additionally or alternatively, the first fastener may be inserted through the outer surface 232 of the second housing 152. The first fastener may be electrically conductive to enable current flow through the first fastener.

At process block 306, the control board 98 may be disposed into the housing. For example, the control board 98 may be inserted between the first housing 150 and the second housing 152. In this manner, the first fastener may be insert through the opening 234 in the control board 98 and the control board 98 is within the ledges 160 of the second housing 152. The first housing 150 is then placed atop the control board 98 such that the inner surface 161 of the first housing 150 abuts the ledges 160 of the second housing 152. In this manner, the control board 98 is inserted between the first housing 150 and the second housing 152 and is in contact with the inner surface 162 of the second housing 152 but not in contact with the inner surface 161 of the first housing 150.

The first fastener may then be coupled to a bridge 238 disposed in the housing, as described in block 308. For example, the first fastener is partially exposed through the opening 234 and/or the opening 158 and the bridge 238 is inserted through the opening 158 to couple to the first fastener at the first side 240. When the first fastener is coupled to the bridge 238, a force may be imparted to couple the control board 98 onto the second housing 152 and reduce movement between the two components.

At process block 310, the shunt 146 is disposed in the cavity 173 of the first housing 150. Specifically, the shunt assembly 104 is inserted such that the opening 168 is aligned with the opening 158. When the shunt assembly 104 is inserted, the bridge 238 may abut against the shunt assembly 104 since the bridge 238 may be too large to fit through a diameter of the opening 168.

After the shunt assembly 104 is disposed in the cavity 173, at process block 312, a second fastener, which may be of the second set of fasteners 236, is coupled to the bridge 238. In some embodiments, the second fastener may be inserted through the opening 168 of the shunt and through the opening 158 of the first housing 150 to couple to the second side 242 of the bridge 238. Coupling the second fastener may couple the shunt assembly 104 to the first housing 150 and the first housing 150 to the control board 98. As a result, the shunt assembly 104, the first housing 150, the control board 98, and the second housing 152 are coupled to one another.

By performing the process 300 of FIG. 9, the components of the battery system 12 may be secured to reduce movement between the components that may affect electrical connections within the battery system 12. Additionally, if forces are imparted onto the battery system 12, such as via a bus bar coupled to the first shunt post 177 and/or the second shunt post 178, a resulting torsional force 245 may propagate to the shunt assembly 104 and may be dissipated to the first housing 150, the first set of fasteners 230, the second set of fasteners 236, and/or the bridges 238, thereby reducing the force on the shunt assembly 104B and/or the control board 98.

Accordingly, the technical effects of the techniques provided by the present disclosure include improving implementing a shunt for battery systems. In some embodiments, a control board may be disposed within a housing and a shunt may be disposed atop the housing in a cavity and coupled to the control board via a pin. The pin may be electrically conductive and be inserted into a receptacle of the control board to place the shunt in electrical connection with the control board. In additional or alternative embodiments, the control board may be disposed within the housing, the shunt may be disposed atop the housing in the cavity, and electrically conductive fasteners may couple the shunt, the housing, and the control board together and place the shunt in electrical connection with the control board. In this manner, forces imparted on the shunt may be absorbed by the housing and/or components used for coupling, rather than by the control board, thereby increasing measurement accuracy of current flowing through the shunt. Moreover, the technical effects of the present disclosure may include reducing a number of components of the battery system, such as separate systems to measure the current flow and control operations of the electrical system, as the control board may include circuitry to perform both processes.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A battery system, comprising:
   one or more battery cells configured to store electrical energy and to output electrical power using the electrical energy;
   a first housing comprising a cavity formed on a first outer surface of the first housing, wherein the cavity comprises a first sidewall;
   a shunt disposed within the cavity formed in the first housing, wherein the shunt comprises a first side surface that directly contacts the first sidewall to facilitate dissipating torsional force exerted on the shunt;
   a control board disposed within the first housing, wherein the control board comprises:
      sensing circuitry configured to determine an operational parameter of the one or more battery cells using the shunt; and
      control circuitry configured to facilitate controlling operation of the one or more battery cells based at least in part on the operational parameter; and
   a first connector assembly that electrically couples the shunt to the sensing circuitry of the control board, wherein the first connect assembly comprises:
      a first spacing connector disposed between the control board and an inner surface of the first housing; and
      a first securing connector that extends through the shunt and is coupled to the first spacing connector through the first housing.

2. The battery system of claim 1, comprising a first bus bar electrically coupled between the one or more battery cells and the shunt, wherein:
   the shunt comprises a first shunt post directly coupled to the first bus bar; and
   the first bus bar is configured to propagate the torsional force to the shunt via the first shunt post when the torsional force is exerted on the first bus bar.

3. The battery system of claim 2, comprising a second bus bar electrically coupled to the shunt, wherein:
   the shunt comprises a second shunt post directly coupled to the second bus bar; and
   the second bus bar is configured to propagate the torsional force to the shunt via the second shunt post when the torsional force is exerted on the second bus bar.

4. The battery system of claim 2, wherein the first shunt post extends from the shunt in a direction parallel to the first side surface of the shunt.

5. The battery system of claim 1, wherein:
the cavity comprises a second sidewall; and
the shunt comprises a second side surface that directly contacts the second sidewall to facilitate dissipating torsional force exerted on the shunt.

6. The battery system of claim 1, comprising a second connector assembly that electrically couples the shunt to the sensing circuitry of the control board, wherein the second connect assembly comprises:
a second spacing connector disposed between the control board and the inner surface of the first housing; and
a second securing connector that extends through the shunt and is coupled to the second spacing connector through the first housing.

7. The battery system of claim 6, wherein:
the first securing connector is configured to be coupled to a first end of the first spacing connector through the control board; and
the first securing connector is configured to be coupled to a second end of the second spacing connector opposite the first end.

8. The battery system of claim 7, wherein:
the first spacing connector comprises a conductive bridge; and
the first securing connector comprises a first screw that extends through the shunt, the first outer surface of the first housing, and the first end of the first spacing connector, and wherein the first securing connector comprises a second screw that extends through a second outer surface of the first housing, the control board, and the second end of the spacing connector, and wherein the second outer surface is opposite the first outer surface.

9. The battery system of claim 8, wherein:
the second spacing connector comprises a receptacle cup secured to the control board at a third end; and
the second securing connector comprises a press fit pin that extends into a fourth end of the receptacle cup to facilitate securing the shunt within the cavity.

10. The battery system of claim 1, wherein the first housing comprises press fit ridges formed along the first sidewall of the cavity to facilitate securing the shunt within the cavity.

11. The battery system of claim 1, comprising a battery module, wherein the battery module comprises:
a second housing, wherein the one or more battery cells, the shunt, and the control board are disposed within the second housing; and
a battery terminal configured to electrically couple the battery module to an electrical device, wherein the shunt is electrically coupled between the one or more battery cells and the battery terminal.

12. A battery system, comprising:
a housing comprising a cavity formed on a first outer surface of the housing, wherein the cavity comprises a sidewall;
a shunt disposed within the cavity formed in the housing, wherein the shunt comprises a side surface that directly contacts the sidewall to facilitate dissipating torsional force exerted on the shunt, wherein the shunt is configured to be electrically coupled to a bus bar of the battery system;
a control board disposed within the housing, wherein the control board comprises:
sensing circuitry configured to determine an operational parameter of the battery system; and
control circuitry configured to facilitate controlling operation of the battery system based at least in part on the operational parameter; and
a first connector assembly that electrically couples the shunt to the sensing circuitry of the control board, wherein the first connect assembly comprises:
a first spacing connector disposed between the control board and an inner surface of the housing; and
a first securing connector that extends through the shunt and is coupled to the first spacing connector through the housing.

13. The battery system of claim 12, wherein the shunt comprises a first shunt post and a second shunt post, wherein the first shunt post and the second shunt post extend from the shunt in a direction parallel to the side surface of the shunt, wherein the shunt is configured to be electrically coupled to the bus bar via the first shunt post or the second shunt post.

14. The battery system of claim 12, wherein the battery system comprises a second connector assembly that electrically couples the shunt to the sensing circuitry of the control board, wherein the second connect assembly comprises:
a second spacing connector disposed between the control board and an inner surface of the housing; and
a second securing connector that extends through the shunt and is coupled to the second spacing connector through the housing.

15. The battery system of claim 14, wherein:
the first spacing connector comprises a conductive bridge;
the first securing connector comprises a first screw that extends through the shunt, the first outer surface of the first housing, and a first end of the conductive bridge, and wherein the second securing connector comprises a second screw that extends through a second outer surface of the first housing, the control board, and a second end of the conductive bridge, and wherein the second outer surface is opposite the first outer surface;
the second spacing connector comprises a receptacle cup secured to the control board at a third end; and
the second securing connector comprises a press fit pin that extends into a fourth end of the receptacle cup.

16. The battery system of claim 14, wherein current is configured to flow through the shunt, the first connector assembly, the second connector assembly, and the control board, wherein the operational parameter is an amount of current.

17. The battery system of claim 12, wherein the housing comprises an insulative material configured to impede current flow through the housing.

18. A battery system, comprising:
a first housing comprising a cavity formed on an outer surface of the first housing, wherein the cavity comprises a first sidewall;
a second housing implemented to be disposed adjacent to an inner surface of the first housing;
a shunt disposed within the cavity formed in the first housing, wherein the shunt comprises a side surface that directly contacts the first sidewall to facilitate dissipating torsional force exerted on the shunt, wherein the shunt is implemented to be electrically coupled to a bus bar of the battery system;
a control board disposed between the first housing and the second housing, wherein the control board comprises:
sensing circuitry implemented to determine an operational parameter of the battery system; and control circuitry implemented to facilitate controlling operation of the battery system based at least in part on the operational parameter; and a connector assembly that electrically couples the shunt to the sensing circuitry of the control board, wherein the connect assembly comprises:

a conductive bridge disposed between the control board and the first housing; and a first screw that extends through the shunt and the first housing, wherein the first screw is implemented to couple to a first end of the conductive bridge; and a second screw that extends through the second housing and the control board, wherein the second screw is implemented to couple to a second end of the conductive bridge.

19. The battery system of claim 18, wherein the second housing comprises a second sidewall, wherein the second housing comprises ridges formed along the second sidewall, and wherein the first housing and the control board are implemented to contact the second sidewall.

20. The battery system of claim 18, wherein current is implemented to flow through the shunt, the first screw, the conductive bridge, the second screw, and the circuit board, wherein the operational parameter is an amount of current.

* * * * *